United States Patent [19]

Pepper

[11] Patent Number: 4,762,397

[45] Date of Patent: Aug. 9, 1988

[54] OPTICAL PHASE CONJUGATOR WITH SPATIALLY RESOLVABLE THRESHOLDING UTILIZING LIQUID CRYSTAL LIGHT VALVE

[75] Inventor: David M. Pepper, Malibu, Calif.

[73] Assignee: Hughes Aircraft Company, Los Angeles, Calif.

[21] Appl. No.: 64,975

[22] Filed: Jun. 19, 1987

[51] Int. Cl.$^4$ .................................................. G02F 1/13
[52] U.S. Cl. ................................ 350/331 R; 350/342; 350/347 E; 350/347 V
[58] Field of Search .................... 350/342, 338, 347 V, 350/331 R, 347 E

[56] References Cited

U.S. PATENT DOCUMENTS 4,019,807  4/1977  Boswell et al. ...................... 350/342
4,546,248 10/1985  Craig .................................. 250/225
4,556,986 12/1985  Craig .................................. 350/335

OTHER PUBLICATIONS

C. Giuliano, "Applications of Optical Phase Conjugation", Physics Today, Apr. 1981, pp. 27-35.
A. Yariv, "Phase Conjugate Optics and Real-Time Holography", IEEE J. Quantum Electronics QE-14, Sep. 1978, pp. 650-660.
D. M. Pepper, "Nonlinear Optical Phase Conjugation", Optical Engineering, vol. 21, No. 2, Mar.-Apr. 1982, pp. 155-183.
J. J. Hopfield, "Neural Networks and Physical Systems with Emergent Collective Computational Abilities", Proc. Nat'l. Academy of Science, U.S.A., 1982, vol. 79, pp. 2554-2558.
O. V. Garibyan et al., "Optical Phase Conjugation by Microwatt Power of Reference Waves via Liquid Crystal Light Valve", Optics Communications, vol. 38, No. 1, Jul. 1981, pp. 67-70.

M. Lampton, "Microchannel Image Intensifier", Scientific American, Nov. 1981, pp. 62-71.
"Wide-Brightness-Range Video Camera", NASA Tech Briefs, Fall 1985.

Primary Examiner—Stanley D. Miller
Assistant Examiner—Richard Gallivan
Attorney, Agent, or Firm—V. D. Duraiswamy; A. W. Karambelas

[57] ABSTRACT

Apparatus is disclosed for phase conjugation of an input beam with thresholding of spatially resolvable parts of the beam that have amplitudes greater than a predetermined threshold value. A phase conjugation reflector produces a phase conjugated replica of a specularly reflected and thresholded portion of the input beam, which is retroreflected toward the source of the input beam. All of the spatial components of the phase conjugated replica retain the same relative phase relationships with respect to each other as the incident complex beam. In a preferred embodiment the invention comprises a liquid crystal light valve (LCLV) system, input and output polarizers, and a phase conjugate mirror (PCM). This combination of elements forms a device that can function as a threshold retroreflector with $\sim 10^6$ resolvable elements. Thresholding is accomplished by allowing part of each spatially resolvable component to reach the photoconductive layer on the opposite side of the LCLV dielectric mirror that reflects the component. The dielectric mirror can be made partially transmissive, or an optical feedback path can be provided to convey a portion of each spatially resolvable component to the photoconductive layer behind the point of reflection by the dielectric mirror. Various feedback methods are presented. The phase conjugate mirror can be implemented by means of any of the phenomena which give rise to phase conjugate retroreflection, such as stimulated scattering, stimulated photorefraction, three-wave mixing, or four-wave mixing.

18 Claims, 5 Drawing Sheets

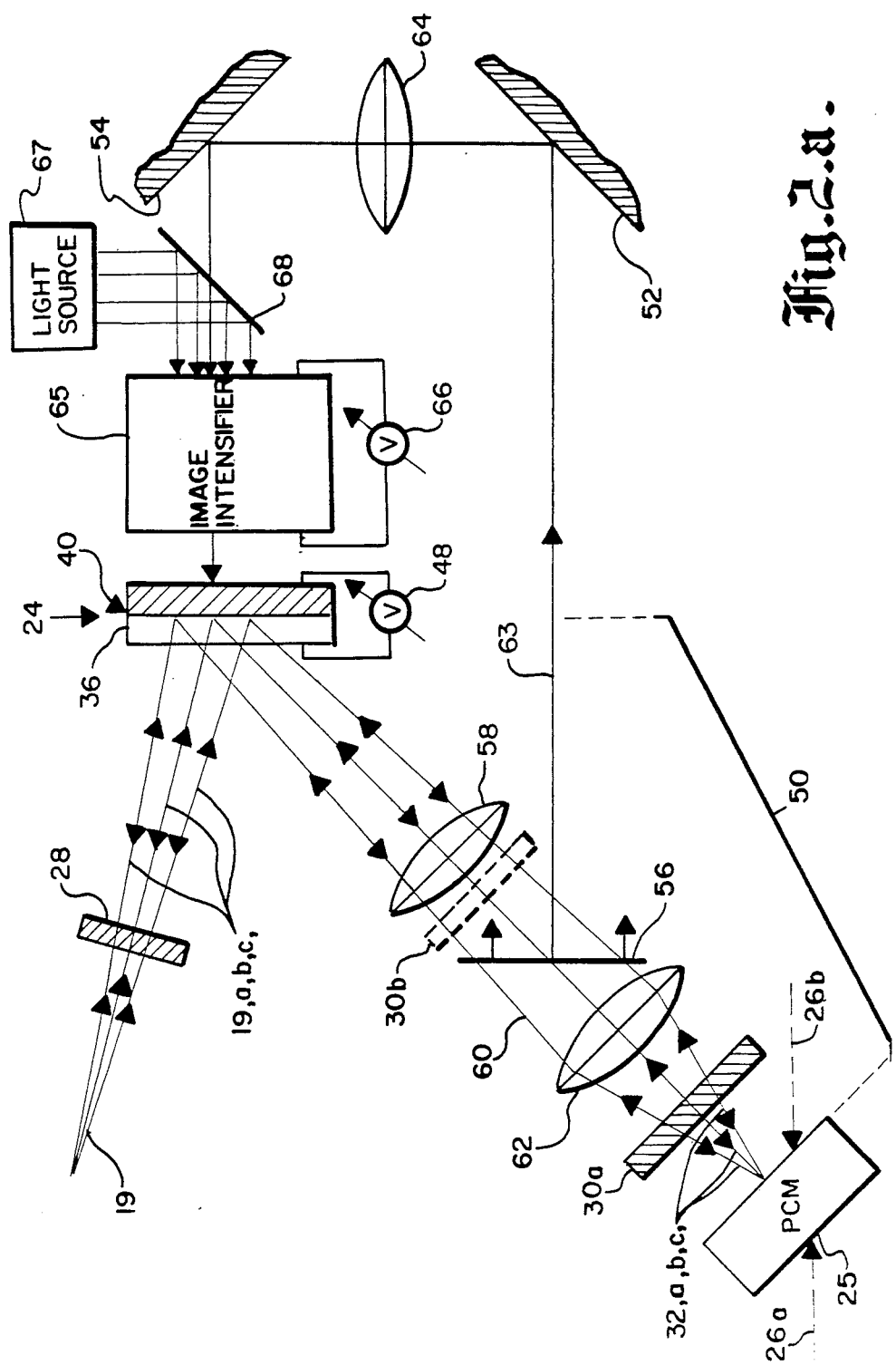

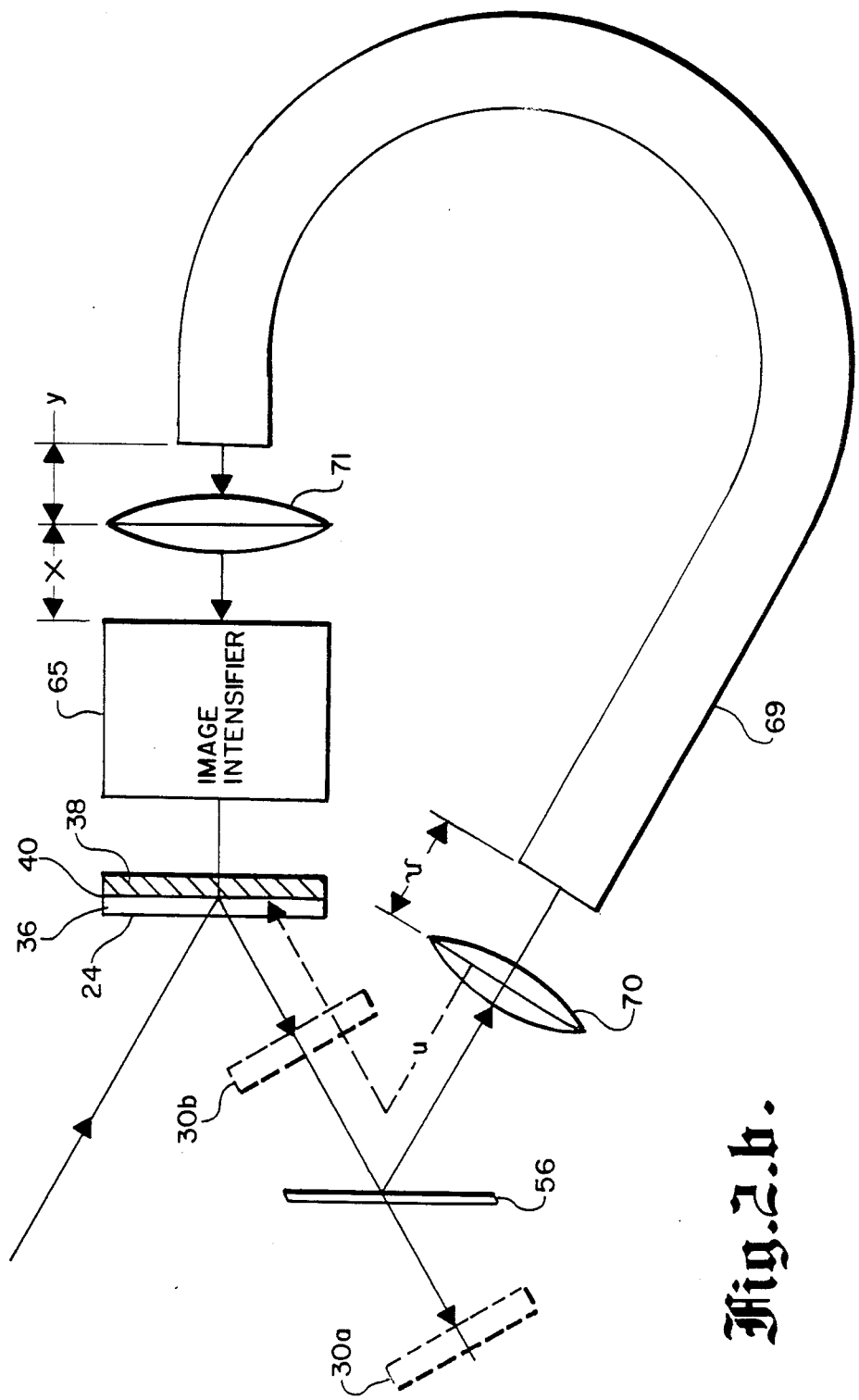
Fig.2.b.

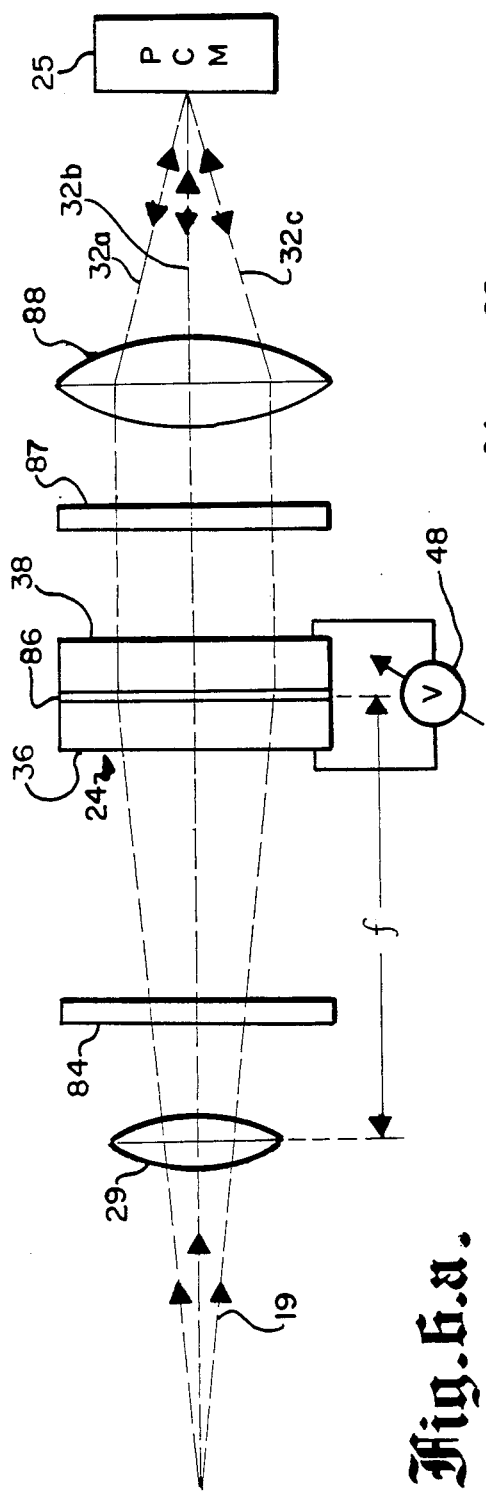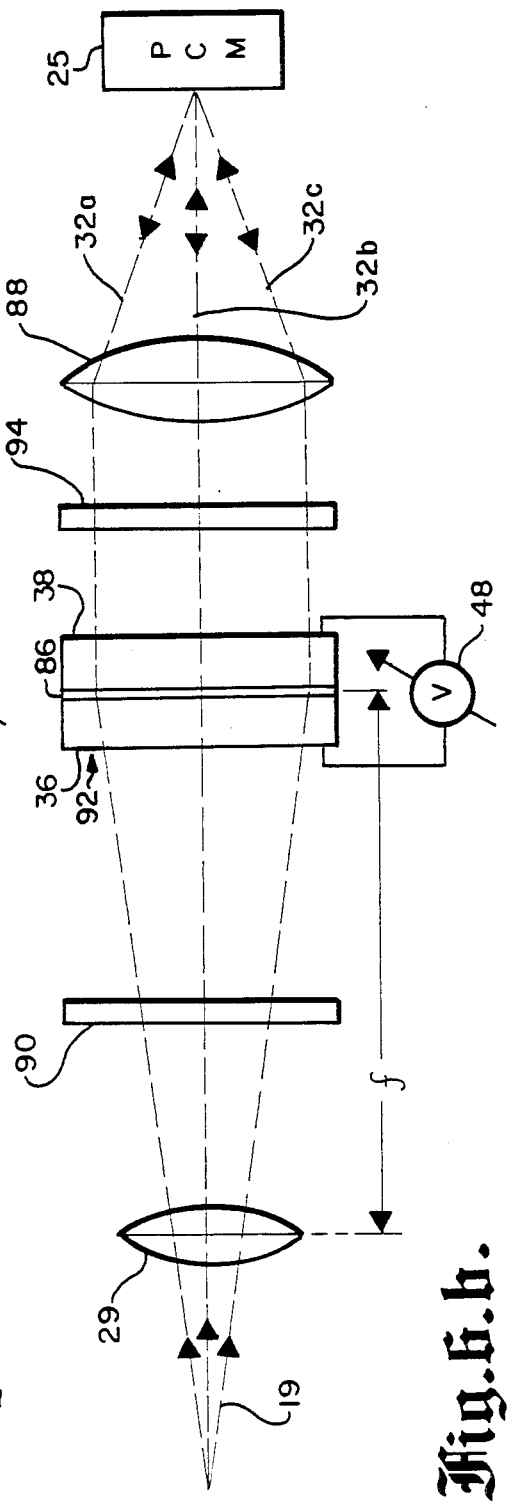

OPTICAL PHASE CONJUGATOR WITH SPATIALLY RESOLVABLE THRESHOLDING UTILIZING LIQUID CRYSTAL LIGHT VALVE

BACKGROUND OF THE INVENTION

1. Field of the Invention

This invention relates to apparatus for optical phase conjugation, and in particular to phase conjugation with spatially resolvable thresholding, which has applications to optical associative memories.

2. Description of Related Art

Phase conjugation is an optical phenomenon that has attracted considerable attention in recent years. Several different ways of producing phase conjugated beams have been discussed in the literature, including four-wave mixing, stimulated Brillouin scattering, three-wave mixing, and photon echo devices. A review of various applications of optical phase conjugation is presented by Giuliano in PHYSICS TODAY, April 1981, pages 27-35, "Applications of Optical Phase Conjugation". A general review of the field is given in the following references: A. Yariv, IEEE, J. Quantum Electronics QE-14, 650 (1978); D. M. Pepper, Optical Engineering 21, page 176, (1982); "Nonlinear Optical Phase Conjugation" by D. M. Pepper in *The Laser Handbook*, volume 4, edited by M. Bass and M. L. Stitch and published by North-Holland in New York in 1985; and the book *Optical Phase Conjugation* edited by R. A. Fisher, published by Academic Press in New York in 1983.

Basically, a phase conjugate reflector produces a retroreflection of an incident beam, with the phase of the reflected beam reversed at each point of reflection from that of the incident beam. Phase conjugate reflection plays a key role in the optical implementation of a type of memory system known as an associative memory.

An associative memory, in which information patterns are stored in such a way that introduction of one pattern or part of one pattern results in the recall of the complete stored pattern (homo-association) or of another (hetero-association), has potential applications in logical operations, pattern recognition, and image understanding. Various types of associative memories have been implemented and reported in the literature.

One approach to implementing such memories employs various algorithms for associative recall using matrix algebraic manipulations on a digital computer. A memory model based on matrix algebra has been described by J. J. Hopfield in his paper "Neural Networks and Physical Systems with Emergent Collective Computational Abilities," Proc. Natl. Academy of Science U.S.A., 1982, Vol. 79, pp. 2554-2558. The Hopfield model utilizes feedback and non-linear thresholding to force the output pattern to be the stored pattern which most closely matches the input pattern. A major drawback of this model is the large storage and computational effort required for manipulation of an association matrix used in the model. For the case of storing two-dimensional image patterns, a four-dimensional matrix is required.

Another approach to implementing an associative memory employs holograms, which are optical memories that are inherently associative in that input reference beams are used to recall associated images. It is a well known property of a hologram that when it is illuminated with a reference beam (referred to here as a probe reference beam) which corresponds to a stored-image-associated reference beam, it will produce an image (referred to here as a probe image) corresponding to the particular stored image with which that probe reference is associated. In a reciprocal manner, when the hologram is illuminated with a probe image corresponding to one of the stored images, the hologram will produce a probe reference beam which is the unique reference beam associated with that particular stored image.

It has also been found that when a probe image containing only a portion of a stored image is used to illuminate a hologram, the resultant probe reference beam generated consists of a composite of reference beams, primarily containing the correct stored-image-associated reference beam. Conversely, when a composite probe reference beam containing only a portion of a storedimage-associated reference beam is used to illuminate a hologram, the resultant probe image generated consists of a composite of stored images, primarily containing the correct stored image associated with that reference beam.

Besides the hologram, the phase conjugate mirror is another useful device for implementing an all-optical associative memory. In the early 1970s a new field emerged in the area of coherent optics, known as nonlinear optical phase conjugation (NOPC). As a result of studies and experiments in that field, the remarkable devices known as phase conjugate mirrors (PCMs) were developed. A rather complete discussion of PCMs, as well as a fairly exhaustive list of references in the field of NOPC, may be found in a paper by the inventor of the present invention, David M. Pepper, entitled "Nonlinear Optical Phase Conjugation," in Optical Engineering, Vol. 21, No. 2, March/April, 1982.

Briefly, a PCM is a device capable of producing a wavefront-reversed replica of a light beam incident on the mirror. This retroreflected beam, called a phase-conjugate beam, exactly retraces the path of the incident beam, ultimately returning to the point of origin of that beam. As an example of the properties of a PCM, consider a diverging beam of light coming from a point source in space. This spreading light wave will, after reflection from a PCM, become a converging beam of light which propagates back to exactly the same original point in space. This beam retracing occurs regardless of the angle of incidence of the beam with respect to the PCM. An ordinary plane mirror, on the other hand, changes only the direction of propagation of the incident optical beam. Thus, an incident diverging beam will continue to diverge after reflection from the mirror. Moreover, since the angle of reflection equals the angle of incidence for a flat mirror, tilting a flat mirror with respect to the angle of incidence results in a change in the angle of reflection which is twice the angle of tilt. A well-known use of a PCM is to restore the optical fidelity of an incident wave which has been distorted as it propagates from its source to the PCM, in consequence of the properties described above.

There are two major classes of PCM devices. One class employs the phenomenon of elastic photon scattering in an optically nonlinear medium. The medium may be chosen from a wide variety of gases (e.g. sodium vapor, carbon dioxide), solids (e.g. gallium arsenide, silicon, germanium) or liquids (e.g. chlorophyll, organics) as well as plasmas, liquid crystals, and aerosols. A particular type of PCM employing elastic photon scattering involves the interaction of four optical beams in the nonlinear medium. This type of PCM is known as a four-wave-mixing (FWM) PCM. The four beams involved include the incident input beam, the outgoing conjugate beam, and two input pump waves which act to sensitize the medium. One advantage of a FWM PCM is that it can be set up to amplify the phase conjugate beam to give it an amplitude exceeding that of the incident input beam.

Another class of PCM devices employs the phenomenon of inelastic photon scattering in a nonlinear medium. Interactions such as Raman, Brillouin, photorefractive, and Rayleigh scattering fall in this category. A feature of this class of PCMs is the passive nature of the phenomenon. The only optical beam required is the input wave to be conjugated. No additional sources such as pump waves are required. However, the amplitude of the conjugate wave is less than that of the input wave.

There is an excitation threshold associated with any self-pumped phase conjugate mirror, namely one involving a single input beam. With the other, nonthresholding types of phase conjugators it is possible, by putting sufficient power into the pump beams, to make an "amplifying" PCM with a reflectivity greater than unity. All these phenomena are described in articles and books covering the topic of nonlinear optics, such as, for example, the third edition of the book entitled *Optical Electronics*, written by Amnon Yariv and published in 1986 by Holt, Rinehart, and Winston in New York; the article "Nonlinear Optical Phase Conjugation" by D. M. Pepper in *The Laser Handbook*, volume 4, edited by M. Bass and M. L. Stitch and published by North-Holland in New York in 1985; and the book *Optical Phase Conjugation* edited by R. A. Fisher, published by Academic Press in New York in 1983.

An associative holographic memory apparatus employing phase conjugate mirrors is disclosed in the U.S. Pat. application entitled "Associative Holographic Memory Apparatus Employing Phase Conjugate Mirrors," by Marom et al., Ser. No. 786,884, U.S. Pat. No. 4,739,496, and in a continuation-in-part of that application entitled "Associative Holographic Memory Apparatus Employing Phase Conjugate Mirrors and a Two-Wave Mixing Contra-Directional Coherent Image Amplifier," by Owechko et al., Ser. No. 821,237, both assigned to the assignee of the present invention, Hughes Aircraft Company. These applications disclose apparatus for recalling a stored image by using an input image which includes a portion of the stored image. The apparatus includes a hologram having the stored image written on it simultaneously with a stored-image-associated reference beam. The hologram has the properties of providing a probe reference beam in response to an incident probe image and, in a reciprocal manner, of providing the probe image in response to the probe reference beam.

Two phase conjugate mirrors are employed in the basic configuration. The first phase conjugate mirror includes a thresholding function whereby a phase conjugate of only those components of the probe reference beam which exceed a predetermined threshold level of beam intensity is conveyed back to the hologram. The threshold can be either "hard" or "soft" (i.e., there can be either a strong or weak dependence to the phase conjugate reflectivity as a function of incident intensity). The first phase conjugate mirror may also include amplification so that the amplitude of the phase conjugated probe reference beam can be greater than that of the probe reference beam. The level of amplification can be made sufficient to overcome any undesirable losses in the hologram and the second phase conjugate mirror, whereby a phase conjugate resonator cavity is formed by the combination of the first and second mirrors. The resonator cavity acts to cause the output image to converge to the stored image. Alternate embodiments of the invention are described which employ a multiple storage and erasure hologram, and which employ only a single phase conjugate mirror.

Using a phase conjugate mirror to provide the thresholding function limits the choice of phase conjugate mirrors to the class of "self-pumped" phase conjugation devices. However, once a given beam is above the threshold of this class of phase conjugate mirrors, any beams that spatially overlap the region in the mirror that contains the first beam will also be reflected (conjugated), thereby negating the desirable thresholding type of discrimination sought. For the implementation of an efficient all-optical associative memory it would be highly desirable to use a spatially resolving phase conjugate mirror with a threshhold characteristic. No such device exists in the related art. It has been postulated that an array of independent phase conjugators, each with its own threshold characteristic, can fill this requirement. For example, an array of pumpless conjugators such as stimulated Brillouin cells or photorefractive media has been suggested. However, the phase relationships among an array of pumpless conjugators are randomly distributed because of the random noise distributions from which each conjugator is "seeded." Unless the conjugator array is capable of maintaining the same phase relationship of the spatial components of the incident and retroreflected beams, the system will not function efficiently, especially in the case of a heteroassociative memory configuration. The second phase-conjugate mirror (PCM) wavefront-reverses the object beam. The object beam contains a complex distribution of plane waves, whose relative phase must be preserved upon reflection in order for the system to function properly. In general, this PCM is not a thresholding type of device. However, in certain applications, it may be desirable to implement a spatially resolvable thresholding operation in addition to the conjugation function. In such a case, the relative phase relationship must be preserved.

SUMMARY OF THE INVENTION

In view of the foregoing problems associated with the related art, it is a feature of the invention to implement a key element in an efficient all-optical associative memory.

It is another feature of this invention to provide a novel spatially resolving phase conjugator with a threshold characteristic.

In the accomplishment of these and other features of the invention, apparatus for phase conjugation of an input light beam is provided with thresholding of spatially resolvable parts of the beam. A means for spatial light intensity modulation and specular reflection selects spatially resolvable components of the input beam that have amplitudes greater than a predetermined "hard" or "soft" threshold value. A phase conjugation reflector retroreflects the complex conjugate of the selected spatially resolvable components which are incident on it. As a result, a phase conjugated replica of a specularly reflected and thresholded portion of the input beam is retroreflected toward the source of the input beam.

Any general spatial light modulator may be employed. In a preferred embodiment the invention comprises a liquid crystal light valve (LCLV) system operating in a display mode and in series with a phase conjugate mirror (PCM). The PCM can be either a thresholding type or a nonthresholding type. This combination of elements forms a device that can function as a threshold retroreflector with $\sim 10^6$ resolvable elements. An input beam is first polarized and then reflected from the LCLV, which in combination with a second polarizer functions as a reflective, spatially addressable device with a "hard" or "soft" threshold. The specularly reflected thresholded beam then strikes the PCM, which time-reverses the spatial components of the beam that are above the threshold set by the LCLV and the polarizers.

An input polarizing means polarizes the input beam before it strikes the liquid crystal light valve. An output polarizing means is disposed in an optical path between the liquid crystal light valve and the phase conjugation mirror. Photoconductive and liquid crystal layers of the liquid crystal light valve are separated by a dielectric mirror and connected in series to a source of predetermined fixed voltage. A transmitted fraction or an externally fed-back portion of each incident spatially resolvable component impinging on the LCLV strikes the photoconductive layer.

The resistance of the photoconductive layer changes locally in relation to the intensity of the spatially resolvable component, and a change in the voltage across the liquid crystal layer occurs at that location. The polarization of each spatially resolvable component after twice traversing the liquid crystal layer depends on the original intensity of the component, so that the combination of the liquid crystal light valve with the input and output polarizing means provides a thresholding mechanism which selects spatially resolvable components with intensities exceeding a predetermined threshold value.

There are several alternative ways of allowing part of each spatially resolvable component to reach the photoconductive layer on the opposite side of the dielectric mirror that reflects the component. The dielectric mirror can be made partially transmissive, in which case a fixed fraction of the light impinging on it feeds through to the photoconductive layer. Each fedthrough portion is automatically in spatial registration with the point of reflection, and this arrangement has the additional advantage of not being susceptible to vibrations. Alternatively, an optical feedback path can be provided to convey a portion of each spatially resolvable component to the photoconductive layer behind the point of reflection on the dielectric mirror. One possible method for doing this includes a beamsplitter in conjunction with various reflective elements. An image intensifier placed in front of the "write" side of the liquid crystal light valve can reduce the fraction of light that needs to be fed back. Another possible feedback method makes use of a video sensor, video signal processing electronics, and an output display device. The output image of the display device is fed back to the photoconductive layer of the liquid crystal light valve in spatial registration with the beam incident on the dielectric mirror.

After specular reflection, the beam composed of the individually thresholded spatially resolvable components is focused onto a phase conjugate mirror which retroreflects the beam back through the system toward the source of the beam. The phase conjugate mirror can be implemented by means of any of the phenomena which give rise to phase conjugate retroreflection, such as stimulated scattering, stimulated photorefraction, three-wave mixing, or four-wave mixing. There is a excitation threshold associated with any self-pumped phase conjugate mirror (involving a single input beam). With the other, nonthresholding types of phase conjugators it is possible, by putting sufficient power into the pump beams, to make an "amplifying" PCM with a reflectivity greater than unity.

These and other features and advantages of the invention will be apparent to those skilled in the art from the following detailed description of preferred embodiments, taken together with the accompanying drawings, in which like reference numerals refer to like parts.

BRIEF DESCRIPTION OF THE DRAWINGS

FIG. 2a is a diagram of a preferred embodiment of the apparatus of the present invention, for optical phase conjugation with spatially resolvable thresholding.

FIG. 2b is a diagram of part of an optical feedback arrangement using a bundle of optical fibers.

FIG. 6a is a diagram of an alternative embodiment of the invention using a first type of transmissive spatial light modulation means.

FIG. 6b is a diagram of an alternative embodiment of the invention using a second type of transmissive spatial light modulation means.

DESCRIPTION OF THE PREFERRED EMBODIMENTS

Figure 1:
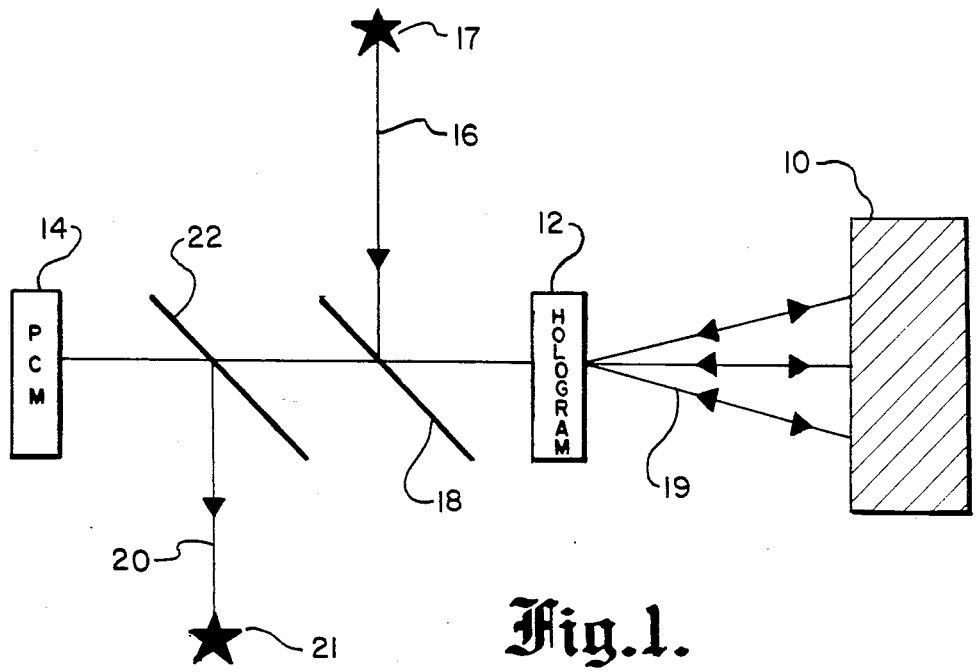
FIG. 1 is a diagram of a basic all-optical associative memory including the optical phase conjugator with spatially resolvable thresholding of the present invention.

FIG. 1 is a schematic diagram of a basic all-optical associative memory, such as the one described in the previous Hughes patent applications referred to above, but employing the thresholding spatially resolving phase conjugate mirror 10 of the present invention to enhance the efficiency and versatility of the overall system. A holographic memory 12 and a second phase conjugate mirror 14 are also employed to form an associative holographic memory. An input beam 16 with the image of an input object 17 enters the associative holographic memory by way of a first beamsplitter 18. A diffracted probe reference beam 19 from the hologram 12 is incident on the invention 10. A spatially resolved and thresholded phase conjugated probe reference beam as generated by the invention 10 travels back to the hologram 12. The probe image provided by the hologram 12 is conveyed to the second phase conjugate mirror 14, which conjugates it and sends it back to the hologram 12. A portion of the phase conjugated beam generated by the second phase conjugate mirror 14 exits the associative holographic memory as an output beam 20 with the image of the associated output object 21 via a second beamsplitter 22.

The holographic memory 12, which may be in the form of a photographic plate, has many different images stored on it. Each stored image is written onto the hologram 12 using a unique reference beam associated with that image (referred to here as a stored-image-associated reference beam). Generally, images are stored on the hologram using plane wave reference beams.

A preferred embodiment of the invention 10 is shown in FIG. 2a. The spatially resolvable threshold phase conjugator 10 comprises a spatial light modulator, in this particular embodiment a liquid crystal light valve (LCLV) 24 operating in display mode, and a phase conjugate mirror (PCM) 25. The PCM 25 can be a threshold-type self-pumped device, or may be a non-thresholding device (capable of producing an amplified time-reversed replica) requiring external pump beams 26a, 26b. An input beam 19 with spatially resolvable components 19a, 19b, and 19c is the diffracted beam from the holographic memory element 12 shown in FIG. 1. The diffracted beam 19 is polarized by input polarizer 28, passes through a lens 29, and is then reflected from the LCLV 24, which is placed at the back focal plane of the lens 29. The combination of LCLV 24 with an output polarizer 30a or 30b functions as a reflective, spatially addressable device with either a "hard" or "soft" threshold, respectively, depending on the position chosen for the polarizer. The specularly reflected thresholded beam 32 then strikes the phase conjugate mirror 25, which time-reverses the spatial components of the beam that are above the LCLV threshold. The "steepness" of the threshold characteristic can be increased by changes in the LCLV drive conditions (and in other ways described below) or by the use of other liquid crystal media (such as ferroelectrics). This combination of elements forms a device that can function as a threshold retroreflector with ~$10^6$ resolvable elements, whose retroreflected optical field components preserve the same relative phase relationships as those of the incident optical beam. The additional elements in FIG. 2a form an optical feedback loop which is explained below after the more detailed description of the LCLV 24 which immediately follows.

Figure 3:
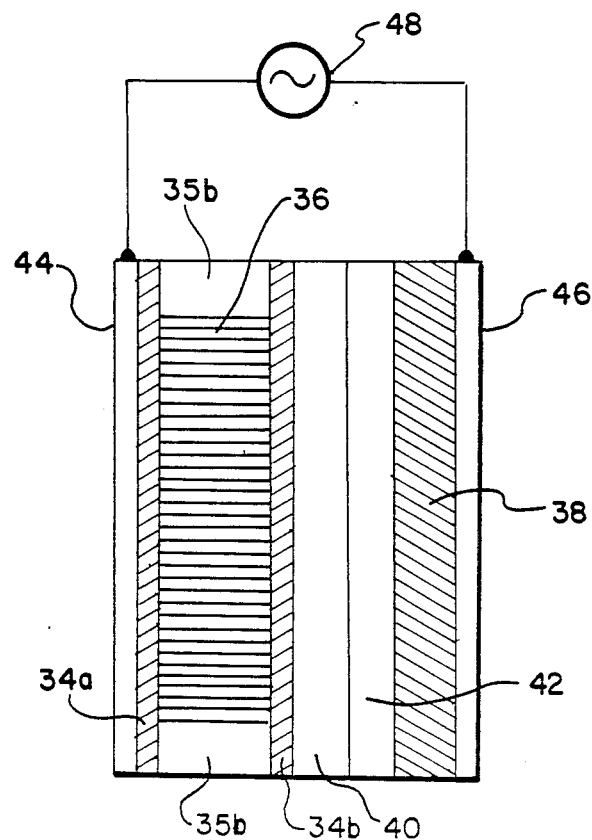
FIG. 3 is a sectional view of a liquid crystal light valve operating in a display mode.

FIG. 3 is a sectional view of a particular type of liquid crystal light valve 24 suitable for the present application. Alignment films 34a,34b spaced apart by spacers 35a,35b confine a liquid crystal layer 36. The liquid crystal layer 36 is separated from a photocondutive layer 38 by a dielectric mirror 40 and an optional light-blocking layer 42. Transparent conductive electrodes 44 and 46 cover the liquid crystal layer 36 and photo-conductive layer 38, respectively. The nematic liquid crystal molecules induce polarizing effects on light that traverses the medium. For example, the Hughes Model H-4060 liquid crystal light valve uses nematic liquid crystals which are twisted. The spatial resolution of this standard display-mode liquid crystal light valve is about 30 lines/mm, so that a clear aperture of 5 cm in diameter possesses over $10^6$ resovable pixel elements.

A voltage source 48 connected to the two transparent electrodes 44 and 46 creates a potential drop across the combination of liquid crystal layer 36 and photoconductive layer 38. This voltage typically alternates at a frequency of 10 kHz and has a value of 6 Volts for a cadmium sulfide photoconducting layer 38. The operation of the photoconductor heterojunction with such an AC voltage supply is taught in liquid crystal light valve patents such as "Reflective Liquid Crystal Light Valve with Hybrid Field Effect Mode," to Boswell et al., U. S. Pat. No. 4,019,807, assigned to Hughes Aircraft Company.

Ordinarily the light-blocking layer 42 and dielectric mirror 40 separate the liquid crystal layer 36 from the photoconductive layer 38, preventing the incident spatially resolvable components of light 29a, 29b, and 29c from directly stimulating the photoconducting layer 38. However, in one embodiment of the invention the dielectric mirror 40 is partially transmissive, and there is no light-blocking layer 42, so that a fraction of the intensity of the incident spatially resolvable component intensity "leaks" through to the photoconductive layer 38, not unlike that discussed by O. V. Garibyan et al. in "Optical Phase Conjugation by Microwatt Power of Reference Waves via Liquid Crystal Light Valve," *Optical Communications*, vol. 38, no. 1, July 1, 1981, pp. 67–70. If light from such a "leaky" dielectric mirror 40 strikes the photoconductive layer 38, the light liberates photoelectrons, causing a small current to flow and hence the voltage to change across the liquid crystal layer 36. This voltage change, proportional to the brightness of the spatially resolvable component, generates a commensurate change in the local polarizing property of the liquid crystal layer 36 along the optical path between the front of the liquid crystal light valve and the dielectric mirror 40.

Figure 4:
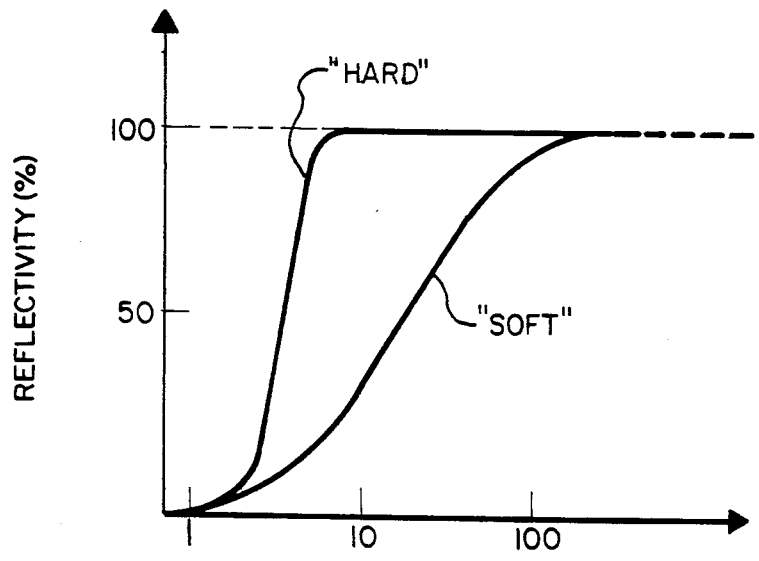
FIG. 4 is a graph of the thresholding characteristic of the invention.

Referring back to FIG. 2a, it can be seen that output polarizer 30a or 30b is disposed in either of two possible positions in a second optical path 50 between the liquid crystal light valve 24 and the phase conjugation mirror 25. FIG. 4 is a graph of the effective reflectivity of the combination of LCLV 24 followed by output polarizer 30a or 30b versus intensity of light reaching the photoconductive layer 38. The upper curve in FIG. 4 corresponds to a "harder" threshold curve which would be the result to placing the output polarizer 30a between the LCLV 24 and the beamplitter 56. Placing the output polarizer 30b between the beamplitter 56 and the phase conjugate mirror 25 gives a "softer" threshold curve such as the lower curve in FIG. 4.

Again referring back to FIG. 2a, in the preferred embodiment an external optical feedback path is provided for conveying part of the light specularly reflected from the dielectric mirror 40 around to the photoconductive layer 38 of the LCLV 24. An externally fed-back portion of each incident spatially resolvable component impinging on the LCLV 24 strikes the photoconductive layer 38. The resistance of the photoconductive layer 38 changes locally in relation to the intensity of the spatially resolvable component, and a change in the voltage across the liquid crystal layer occurs at that location. The polarization of each spatially resolvable component 32a,32b,32c after twice traversing the liquid crystal layer 36 depends on the original intensity of the component 19a,19b,19c, so that the combination of the LCLV 24 with the input polarizing means 28 and output polarizing means 30a or 30b, provides a thresholding mechanism which selects spatially resolvable components with intensities exceeding a predetermined threshold value.

There are several alternative ways of allowing part of each spatially resolvable component to reach the photoconductive layer 38 on the opposite side of the dielectric mirror 40 in the LCLV 24 that reflects the component. In each case the beam incident from the back side of photoconductive layer 38 of the LCLV 24 must be in accurate registration with the beam striking the dielectric mirror 40 from the front side. More precisely, the charge pattern produced by the fed-back beam in the photoconductive layer 38 and the electric field applied to the liquid crystal layer 36 must be in exact spatial registration with the beam incident on the dielectric mirror 40, since it was by means of a portion of that beam that they were produced.

As a further requirement, the optical feedback system which conveys the incident spatially resolvable components from the front to the back of the liquid crystal light valve 24 must not invert the image in the plane of the feedback system. In other words, an even number of reflective surfaces is required, as for example, in the arrangement using plane mirrors 52 and 54 shown in FIG. 2a.

The optical feedback system includes a beamsplitter 56 placed in a portion of the second optical path 50 where the beam 32 has been collimated by an optical relay lens 58. The transmitted portion 60 of the beam is focused on the phase conjugate mirror 25 by focusing lens 62. The portion 63 of the beam reflected by the beamsplitter 56 can be conveyed by various schemes which are well known in the art to complete the feedback loop to the photoconductive layer 38. It is possible to employ only reflective components, a combination of refractive and reflective components, or a bundle of optical fibers used with lenses as shown in FIG. 2b and described below.

Referring still to FIG. 2a, an optional image intensifier 65 placed in front of the "write" side of the liquid crystal light valve 24 can reduce the fraction of light that needs to be fed back. Adjusting the variable power drive 66 for the image intensifier 65 allows further control of the thresholding capability of the invention. An optical means for adjusting the threshold can be optionally added in the form of a flood light source 67 which delivers an adjustable amount of light to the image intensifier 65 via the beamsplitter 68. One possible image intensifying device device, the microchannel image intensifier, is described in an article by Michael Lampton in the November, 1981 Issue of SCIENTIFIC AMERICAN.

FIG. 2b is a diagram of part of an optical feedback arrangement utilizing a coherent optical fiber bundle 69 in conjunction with lenses 70 and 71. In the diagram (which is not drawn to scale), u is the distance along the light path between LCLV 24 and lens 70, v is the distance from lens 70 to a first end face of optical fiber bundle 69, y is the distance between a second end face of optical fiber bundle 69 and lens 71, and x is the distance between lens 71 and image intensifier 65. The distances u,v,x, and y are chosen so that $(vx/uy)=1$, in order to satisfy the requirement of 1:1 imaging of the light fed back to the photoconducting layer 38 of the LCLV 24.

Figure 5:
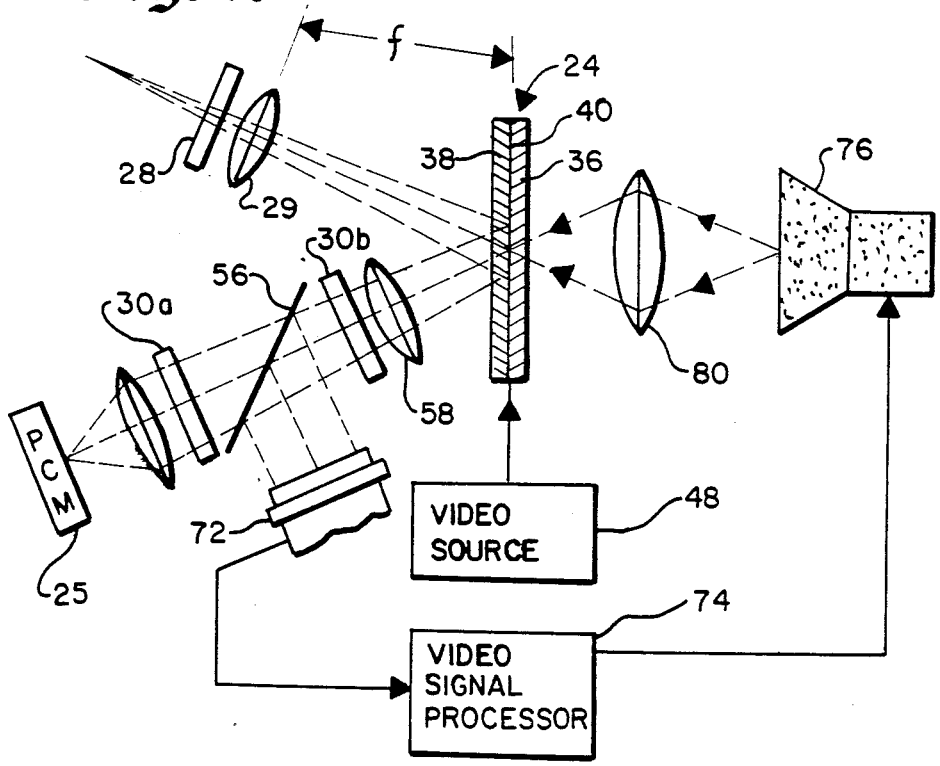
FIG. 5 is a diagram of a feedback arrangement using a video link.

As shown in FIG. 5, another possible feedback method makes use of a video sensor 72, video signal processing electronics 74, and an output display device 76. This arrangement is similar to one described in U.S. Pat. No. 4,546,248 to Glenn D. Craig. The output image of the output display device 76 is fed back to the photoconductive layer 38 of the liquid crystal light valve 24 in spatial registration with the beam 19 incident on the dielectric mirror 40. The portion of the beam reflected by beamsplitter 56 is focused by first imaging lens 78 onto video sensor 72, which senses the image and converts it into an electrical output signal. The beamsplitter 56 can be a polarizing type beamsplitter or a polarizer 30a or 30b can be disposed between a nonpolarizing beamsplitter and the video sensor 72. Either choice gives a relatively "hard" threshold compared to arrangements in which the output polarizer does not form part of the feedback arrangement. The output signal is sent to video signal processor 74, the output of which is connected to a video output display device 76 placed in front of the photoconductive layer 38 of the liquid crystal light valve 24. Video output display device 76 displays an image corresponding to the image sensed by the video sensor 72. A second imaging lens 80 focuses the video output display image onto the photoconductive layer 38 of LCLV 24, so that an image of each specularly reflected spatially resolvable component on the photoconductive layer 38 is in spatial registration with the point of reflection of each spatially resolvable component from the dielectric mirror 40 of the LCLV 24. With this embodiment of the feedback arrangement it is possible to electronically control the thresholding via the video processor 74 of the spatially resolving phase conjugation process.

FIGS. 6a and 6b show two different alternative embodiments of the present invention 10. Both embodiments employ transmissive types of spatial light modulation means. In FIG. 6a an input beam 19 passes through a lens 29 followed by an input polarizer 84 before it strikes liquid crystal light valve 24. The LCLV 24, which is placed at the back focal plane of lens 29, is of a type in which light passing through the liquid crystal layer 36 is transmitted directly into the photoconductive layer 38 through a transparent divider 86. The voltage source 48 impresses a voltage across the liquid crystal and photoconductive layers which is divided up according to their respective resistances. The more intense the light striking the photoconductive layer 38 at a particular location, the lower the resistance and the smaller the voltage drop, resulting in a correspondingly larger voltage drop across the liquid crystal layer 36 at the same location. A larger voltage drop results in a larger polarization shift of the spatially resolved light component passing through the liquid crystal layer 36. An output polarizer 87 is used to control the intensity of the transmitted intensities of the spatially resolved light components according to the shifts in their polarization. The components are all focussed on a phase conjugate mirror 25 by a lens 88. The phase conjugated beam is retroreflected by PCM 25 back through the system.

A second alternative embodiment of the invention 10 using a different type of transmissive spatial light modulation means is shown in FIG. 6b. Here an input beam 19 passes through a first partially transmissive mirror 90 and impinges on a liquid crystal light valve 92 which employs a type and/or configuration of liquid crystal material the refractive index of which changes in response to a change in voltage across the material. This type of phase-only liquid crystal light valve is analogous to the reflective LCLV described in the article by O. V. Garibyan et al. referred to above. Light passing through the liquid crystal layer 36 is transmitted directly into the photoconductive layer 38 through a transparent divider 86. The voltage source 48 impresses a voltage across the liquid crystal and photoconductive layers which is divided up according to their respective resistances. The more intense the light striking the photoconductive layer 38 at a particular location, the lower the resistance and the smaller the voltage drop, resulting in a correspondingly larger voltage drop across the liquid crystal layer 36 at the same location. A larger voltage drop results in a larger shift of refractive index of the liquid crystal layer 36 and hence of the phase of the spatially resolved light component passing through the liquid crystal layer 36. A second partially transmissive mirror 94 in combination with mirror 90 forms a Fabry-Perot interferometric cavity between them. The effective length of the cavity depends on the refractive index of the liquid crystal layer which forms part of the cavity. The transmission of a given spatially resolved light component thus depends strongly on its intensity, since a small shift in the phase can effect a large change in transmission. The spatially resolved components are all focussed on a phase conjugate mirror 25 by a lens 88, and the phase conjugated beam is retroreflected by PCM 25 back through the system.

As can be seen from FIGS. 2a, 6a, and 6b, after specular reflection from, or transmission through, the LCLV all the remaining spatial components are directed into the common phase conjugate mirror 25. Since the thresholding is accomplished with the LCLV 24 and polarizers 28 and 30, the choice of type of PCM is not as constrained as it would be in systems without the present invention. Even nonthresholding PCMs can be employed, in which case optical gain can be provided by varying the intensities of the external pump beams 26a and 26b. The use of a PCM 25 common to all reference beams guarantees that the conjugate beams will have the same phase relationships as those of the incident field. Thus, the wavefront-reversed replica, after a (re-)turn reflection from the LCLV (which, incidentally, will result in additional thresholding) will diffract from the holographic element 12 (see FIG. 1) in a well-defined fashion. Note that if an array of separate, thresholding conjugators were employed, the retroreflected beam would not diffract from the hologram 12 in a well-defined fashion. This is because of the different, random phases due to the noise background in each individual conjugator.

Referring still to FIGS. 2a, 6a, and 6b, it can be seen that the beam composed of the individually thresholded spatially resolvable components 32a, 32b, 32c is focused onto phase conjugate mirror 25 which retroreflects the beam back through the system toward the source of the beam. The phase conjugation mirror 25 may take on different forms in different embodiments of the invention. The PCM 25 can be implemented by means of any of the phenomena which give rise to phase conjugate retroreflection, such as stimulated scattering, stimulated photoreflection, three-wave mixing, or four-wave mixing. The present invention has been described in detail with reference to particular preferred embodiments, but persons possessing ordinary skill in the art to which this invention pertains will appreciate that various modifications may be made without departing from the spirit and scope of the invention.

What is claimed is:

1. An apparatus for optical phase conjugation with individual thresholding of spatially resolvable components of an input beam, comprising:

spatial intensity light modulation means disposed in a first optical path of said input beam, for selecting spatially resolvable components of said input beam that have amplitudes greater than a predetermined threshold value and directing said selected components along a second optical path, and phase conjugation reflection means disposed in said second optical path, for retroreflecting the complex conjugate of said selected spatially resolvable components back along said second and first optical paths, maintaining the same relative phase relationships of the complex beam components to each other before and after reflection.

2. The apparatus of claim 1, wherein said spatial intensity light modulation means comprises:

a specular reflection means; and thresholding means which are operatively connected with said specular reflection means and are responsive individually to a portion of each said spatially resolvable component incident on said specular reflection means to determine whether said component is reflected.

3. The apparatus of claim 1, wherein said spatial intensity light modulation means comprises:

transmission means; and thresholding means which are operatively connected with said transmission means and are responsive individually to a portion of each said spatially resolvable component incident on said transmission means to determine whether said component is transmitted.

4. The apparatus of claim 1, in which said spatial intensity light modulation means comprises:

a liquid crystal light valve, having a photoconductive layer, a liquid crystal layer, and a specularly reflective dielectric mirror that is partially transmissive, said dielectric mirror separating said photoconductive and liquid crystal layers;

input polarizing means disposed in said first optical path, for polarizing said input beam before it strikes said liquid crystal light valve; and output polarizing means disposed in said second optical path between said liquid crystal light valve and said phase conjugation reflection means;

and in which said photoconductive and liquid crystal layers of said liquid crystal light valve are connectable in series to a source of predetermined fixed voltage, so that a transmitted fraction of each incident spatially resolvable light component incident on said photoconductive layer changes the resistance thereof in relation to the intensity of said spatially resolvable component and effects a change in a voltage across said liquid crystal layer, the polarization of each said spatially resolvable component after twice traversing said liquid crystal layer depending on said voltage across said liquid crystal layer, so that the combination of said liquid crystal light valve with said input and output polarizing means provides a thresholding mechanism which selects spatially resolvable components with intensities exceeding a predetermined threshold value.

5. The apparatus of claim 1, in which said spatial intensity light modulation means comprises:

a liquid crystal light valve, having a photoconductive layer, a liquid crystal layer, and a transmissive layer, said transmissive layer separating said photoconductive and liquid crystal layers;

input polarizing means disposed in said first optical path, for polarizing said input beam before it strikes said liquid crystal light valve; and output polarizing means disposed in said second optical path between said liquid crystal light valve and said phase conjugation reflection means;

and in which said photoconductive and liquid crystal layers of said liquid crystal light valve are connectable in series to a source of predetermined fixed voltage, so that a transmitted fraction of each incident spatially resolvable light component on said photoconductive layer changes the resistance thereof in relation to the intensity of said spatially resolvable component and effects a change in a voltage across said liquid crystal layer, the polarization of each said spatially resolvable component depending on said voltage across said liquid crystal layer after traversing said liquid crystal layer, so that the combination of said liquid crystal light valve with said input and output polarizing means provides a thresholding mechanism which selects spatially resolvable components with intensities exceeding a predetermined threshold value.

6. The apparatus of claim 1, in which said spatial intensity light modulation means comprises:

a liquid crystal light valve, having a photoconductive layer, a liquid crystal layer, and a transmissive layer, said transmissive layer separating said photoconductive and liquid crystal layers;

first partially transmissive mirror means disposed in said first optical path, normal to said input beam; and second partially transmissive mirror means disposed in said second optical path between said liquid crystal light valve and said phase conjugation reflection means;

and in which said photoconductive and liquid crystal layers of said liquid crystal light valve are connectable in series to a source of predetermined fixed voltage, so that a transmitted fraction of each incident spatially resolvable light component on said photoconductive layer changes the resistance thereof in relation to the intensity of said spatially resolvable component and effects a change in a voltage across said liquid crystal layer and a corresponding change in the refractive index, the phase of each said spatially resolvable component depending on said voltage across said liquid crystal layer after traversing said liquid crystal layer, so that the combination of said liquid crystal light valve with said first and second partially transmissive mirror means forms a Fabry-Perot interferometer with a cavity whose optical path length varies in response to changes in the refractive index of said liquid crystal layer to provide a thresholding mechanism which selects spatially resolvable components with intensities exceeding a predetermined threshold value.

7. The apparatus of claim 1, wherein said spatial intensity light modulation means comprises:

a liquid crystal light valve, having a photoconductive layer, a liquid crystal layer, and a specularly reflective dielectric mirror, said dielectric mirror separating said photoconductive and liquid crystal layers, so that the polarization of an incident spatially resolvab;e light component changes in response to a change in voltage across said photoconductive layer when said photoconductive and liquid crystal layers are connected in series to a source of predetermined voltage;

input polarizing means disposed in said first optical path, for polarizing said input beam before it strikes said liquid crystal light valve;

optical feedback means for conveying a portion of each said spatially resolvable component in said second optical path to said photoconductive layer of said liquid crystal light valve; and output polarizing means disposed in said second optical path between said liquid crystal light valve and said phase conjugation reflection means.

8. The apparatus of claim 7, further comprising: optical focusing means disposed in said second optical path, for focusing said selected spatially resolvable components of said input beam onto said phase conjugation reflection means; and optical relay means disposed in said second optical path, for relaying a specularly reflected portion of said input beam in collimated form along an optical relay path from said optical relay means to said optical focusing means.

9. The apparatus of claim 8, in which said optical feedback means comprises:

beam dividing means, disposed in said optical relay path, for transmitting a first portion of said beam along said relay path and diverting a second portion of said beam in collimated form along said third optical path;

video sensing means disposed in said third optical path, for sensing an image and converting said image into an electrical output signal;

first feedback imaging means disposed between said beam dividing means and said video sensing means, for imaging said diverted portion of said beam in collimated form onto said video sensing means;

video signal processing means, having an input connected to said video sensing means, and an output, for electronic processing of said output signal from said video sensing means;

video output display means disposed in front of said photoconductive layer of said liquid crystal light valve, having an input connected to said video signal processing means, for displaying an image corresponding to the image sensed by said video sensing means; and second feedback imaging means disposed between said video output display means and said photoconductive layer of said of said liquid crystal light valve, for 1:1 noninverted imaging of said video output display image onto said photoconductive layer of said liquid crystal light valve, so that an image of each specularly reflected spatially resolvable component on said photoconductive layer is in spatial registration with a point of reflection of each said spatially resolvable component from said dielectric mirror of said liquid crystal light valve.

10. The apparatus of claim 8, wherein said optical feedback means comprises:

beam dividing means disposed in said optical relay path for transmitting a first portion of said beam along said relay path and for diverting a second portion of said beam in collimated form along said third optical path; and means for noninverted 1:1 imaging disposed in said third optical path, for imaging of said diverted portion of said beam in collimated form cnto said photoconductive layer of said liquid crystal light valve, so that an image of each specularly reflected spatially resolvable component on said photoconductive layer is in spatial registration with the point of reflection of said spatially resolvable component from said dielectric mirror.

11. The apparatus of claim 10, further comprising image intensification means disposed between said noninverted 1:1 imaging means and said photoconductive layer of said liquid crystal light valve.

12. The apparatus of claim 11, further comprising variable flood lighting means for adding flood light of a predetermined intensity to said portion of each said spatially resolvable component fed back to said photoconductive layer of said liquid crystal light valve.

13. The apparatus of claim 11, in which said image intensification means comprises a microchannel image intensifier.

14. The apparatus of claim 10 in which said means for noninverted 1:1 imaging comprises:
   a bundle of optical fibers having first and second end faces;
   a first light coupling means for coupling said portion of each said spatially resolvable component from said beam dividing means to said first end face of said bundle of optical fibers; and
   a second light coupling means for coupling said portion of each said spatially resolvable component from said second end face of said bundle of optical fibers to said photoconductive layer of said liquid crystal light valve.

15. The apparatus of claim 1, in which said phase conjugation reflection means is a phase conjugate mirror utilizing four-wave mixing.

16. The apparatus of claim 1, in which said phase conjugation reflection means is a phase conjugate mirror utilizing three-wave mixing.

17. The apparatus of claim 1, in which said phase conjugation reflection means is a self-pumped phase conjugate mirror utilizing stimulated scattering.

18. The apparatus of claim 1, in which said phase conjugation reflection means is a phase conjugate mirror utilizing stimulated photorefraction.

* * * * *